United States Patent [19]
Yang et al.

[11] Patent Number: 5,989,961
[45] Date of Patent: Nov. 23, 1999

[54] FABRICATION METHOD OF A VERTICAL CHANNEL TRANSISTOR

[75] Inventors: Jeon Wook Yang; Jae Kyoung Mun; Eung Gie Oh; Jae Jin Lee; Kwang Eui Pyun, all of Daejeon, Rep. of Korea

[73] Assignees: Electronics and Telecommunications Research Institute, Daejeon; Korea Telecom, Seoul, both of Rep. of Korea

[21] Appl. No.: 09/116,904

[22] Filed: Jul. 17, 1998

[30] Foreign Application Priority Data

Dec. 17, 1997 [KR] Rep. of Korea ............ 97-69499

[51] Int. Cl.$^6$ .................................. H01L 21/336
[52] U.S. Cl. .................. 438/270; 438/268; 438/272; 438/212
[58] Field of Search .................. 438/212, 268, 438/270, 271, 272

[56] References Cited

U.S. PATENT DOCUMENTS

| | | |
|---|---|---|
| 4,620,207 | 10/1986 | Calviello . |
| 4,757,029 | 7/1988 | Koury, Jr. . |
| 5,177,027 | 1/1993 | Lowrey et al. .................. 438/270 |
| 5,312,767 | 5/1994 | Shimizu et al. .................. 438/268 |
| 5,403,763 | 4/1995 | Yamazaki . |
| 5,504,359 | 4/1996 | Rodder . |
| 5,686,327 | 11/1997 | Park .................. 438/268 |

OTHER PUBLICATIONS

Z. Rav–Noy et al., "Vertical FET's in GaAs", IEEE Electron Device Letters, vol. EDL–5, No. 7, Jul. 1984, pp. 228–230.

B.A. Vojak et al., "A Self–Aligned Dual–Grating GaAs Permeable Base Transistor", IEEE Electron Device Letters, vol. EDL–5, No. 7, Jul. 1984, pp. 270–272.

S. Adachi et al., "A New Gate Structure Vertical–GaAs FET", IEEE Electron Device Letters, vol. EDL–6, No. 6, Jun. 1985, pp. 264–266.

P.M. Campbell et al., "Trapezoidal–Groove Schottky–Gate Vertical–Channel GaAs FET (GaAs Static Induction Transistor)", IEEE Electron Device Letters, vol. EDL–6, No. 6, Jun. 1985, pp. 304–306.

*Primary Examiner*—Trung Dang
*Attorney, Agent, or Firm*—Jacobson, Price, Holman & Stern, PLLC

[57] ABSTRACT

Disclosed is a method for manufacturing a vertical channel transistor comprising the steps of: selectively implanting a dopant of high concentration into a semiconductor substrate to form a source region; firstly etching the semiconductor substrate using an insulator and a first photoresist pattern as a mask; secondly etching the substrate using a second photoresist pattern having a shape corresponding to said source region as a mask; implanting a dopant of low concentration into the exposed substrate using said second photoresist pattern as a mask to form a vertical channel layer; implanting a dopant of high concentration into the exposed substrate using same mask to form a drain region; activating said dopants, and forming an ohmic contact layer on said drain region; thirdly etching using a third photoresist pattern for exposing the firstly etched portion of the substrate as a mask; depositing a gate metal on the substrate exposed by the thirdly etching; and wiring a metal, respectively. This invention can be easily manufactured a vertical channel transistor having a low parasitic resistance and an extremely small gate length without sophicated complex processes.

6 Claims, 3 Drawing Sheets

FABRICATION METHOD OF A VERTICAL CHANNEL TRANSISTOR

BACKGROUND OF THE INVENTION

1. Field of the Invention

The present invention relates generally to a method for manufacturing semiconductor devices, and more particularly to an improved method for fabricating field effect transistors with vertical channel.

2. Description of the Prior Art

In the past few years, short-channel devices have generated considerable interest. However, conventional submicrometer devices require sophisticated techniques for fabricating the short gate. The reduction of the channel length gives rise to short-channel effects to cause the degradation of device performances, which in turn lowers the device operation speed.

In an effort to avoid aforementioned problems, a vertical channel field effect transistor (FET) has been disclosed. The vertical FET has considerable advantage compare to conventional planar transistors. The dominant features are that the vertical FET structure has made possible the fabrication of submicrometer devices without sophisticated submicrometer lithographic processes, and the source and drain parasitic series resistance can be drastically reduced.

Many of the vertical FET's reported up to date. For example, there are a permeable base transistor, a ballistic-type transistor, and a transistor with vertical channel grown by an epitaxial growing method.

However, since these conventional vertical FET technologies are need for sophisticated submicrometer lithographic processes and advanced crystal growth techniques, the reproduction and mass production are reduced in the fabrication of the vertical FET.

SUMMARY OF THE INVENTION

It is therefore an object of the present invention to provide an improved method for manufacturing a vertical channel transistor which is readily adaptable for mass production and inexpensive to manufacture.

According to a preferred embodiment of this invention, there is provided a method for manufacturing a vertical channel transistor comprising the steps of:

selectively implanting a dopant of high concentration into a semiconductor substrate to form a source region; firstly etching the semiconductor substrate using a insulator and a first photoresist pattern as a mask; secondly etching the substrate using a second photoresist pattern having a shape corresponding to said source region as a mask; implanting a dopant of low concentration into the exposed substrate using said second photoresist pattern as a mask to form a vertical channel layer; implanting a dopant of high concentration into the exposed substrate using same mask to form a drain region; activating said dopants, and forming an ohmic contact layer on said drain region; thirdly etching the substrate using a third photoresist pattern for exposing the firstly etched portion of the substrate as a mask; depositing a gate metal on the substrate exposed by the thirdly etching; and forming a interlayer dielectric film, and forming an ohmic contact layer on the remained source region.

In the present invention, the semiconductor substrate is made of a gallium arsenide substrate.

Preferably, the firstly etching uses an anisotropic etching so as to etch vertically toward the substrate, and the etched depth of firstly etching is more deep than that of the source region.

More preferably, the implanting step of (d) is inclined doped by tilting the substrate in order to form the vertical channel layer with uniform doping level, and the thirdly etching step uses an isotropic etching so as to easily control the thickness of the vertical channel layer and the size of the source.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings are only for the purpose of illustrating a preferred embodiment of the invention and are not to be construed as limiting the invention.

FIG. 1 is a sectional view showing an ion-implanting step for defining a source region of transistor;

FIG. 2 is a sectional view showing an insulator depositing step;

FIG. 3 is a sectional view showing a first etching step using a first photoresist pattern as a mask;

FIG. 4 is a sectional view showing a second etching step using a second photoresist pattern as a mask;

FIG. 5 is a sectional view showing an ion-implanting step for defining a vertical channel region;

FIG. 6 is a sectional view showing an ion-implanting step for defining a drain region;

FIG. 7 is a sectional view showing an ohmic contact step of drain;

FIG. 8 is a sectional view showing a third etching step;

FIG. 9 is a sectional view showing a gate forming step;

FIG. 10 is a sectional view showing a step of flattening a transistor;

FIG. 11 is a sectional view showing an ohmic contact step of source; and

FIG. 12 is a sectional view showing an wiring step.

DESCRIPTION OF THE PREFERRED EMBODIMENTS

Referring now to FIGS. 1–12, a preferred embodiment of this invention will be described in detail. It should be noted that in all embodiments, the preferred substrate starting material is a gallium arsenide (GaAs).

Figure 1:
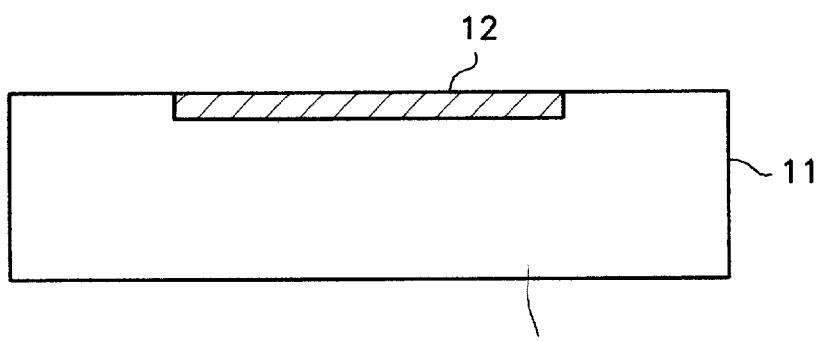
FIGS. 1–12 are schematic cross-sectional process flow diagrams illustrating the major steps in processing a vertical channel transistor according to the present invention.

FIG. 1 is sectional view showing step of selectively implanting a dopant of high concentration into a semiconductor substrate 11 to form a source region 12. More specifically, heavily doped N+ layer 12 is formed by ion-implanting of silicon into the compound semiconductor substrate 11 such as gallium arsenide (GaAs) using a photoresist pattern (not shown) as a mask.

Figure 2:
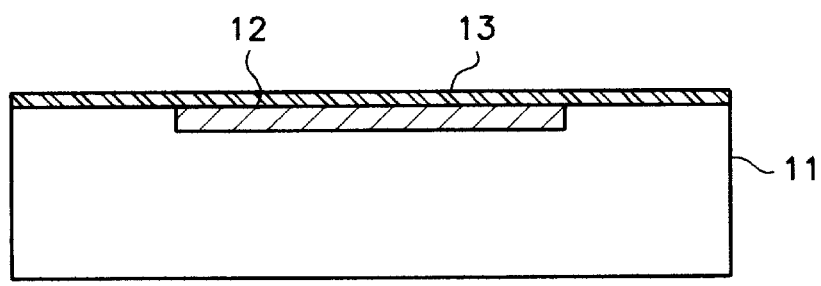

Referring to FIG. 2, after the photoresist pattern is removed, an insulating layer 13 is deposited on the GaAs substrate 11.

Figure 3:
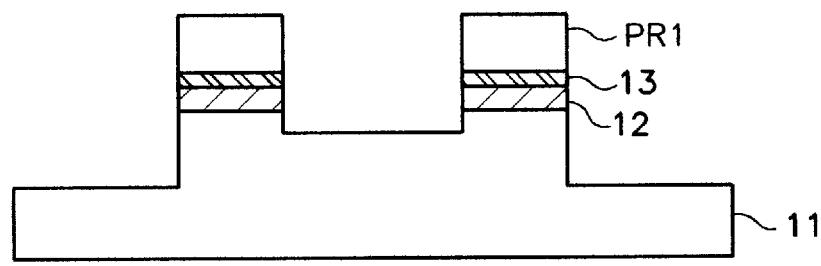

In FIG. 3 illustrating the step of first etching the GaAs substrate 11, a first photoresist pattern PR1 having a size of 0.5 micrometer is formed on the insulating layer 13 by lithography. Then, the insulating layer 13 and the GaAs substrate 11 are sequentially etched until entirely exposed the source region 12 using the first photoresist pattern PR1 as a mask.

At this time, the firstly etched depth of the GaAs substrate 11 is more deep than that of heavily doped N+ source region 12. Also, in order to etch vertically toward the GaAs substrate 11, the step of first etching uses an anisotropic etching.

Figure 4:
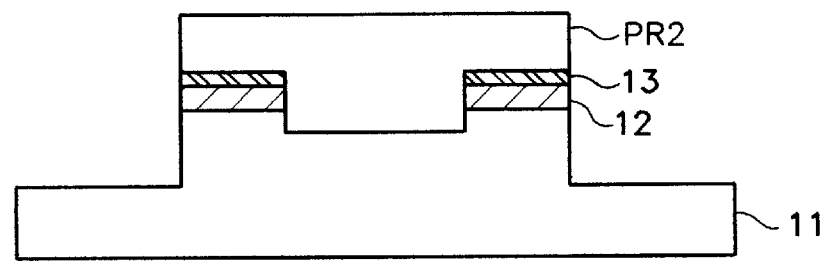

FIG. 4 is sectional view illustrating the step of second etching to define a vertical channel layer and a drain region. Firstly, the first photoresist pattern PR1 is removed. Then, a second photoresist pattern PR2 is formed on the exposed insulating layer 13 and the portion of the exposed GaAs substrate 12. The second photoresist pattern PR2 has a shape corresponding to the source region 12.

Next, the exposed GaAs substrate 11 is anisotropically etched using the second photoresist pattern PR2 as a mask. At this time, the distance between the source and the drain is determined by the second etching depth.

Figure 5:
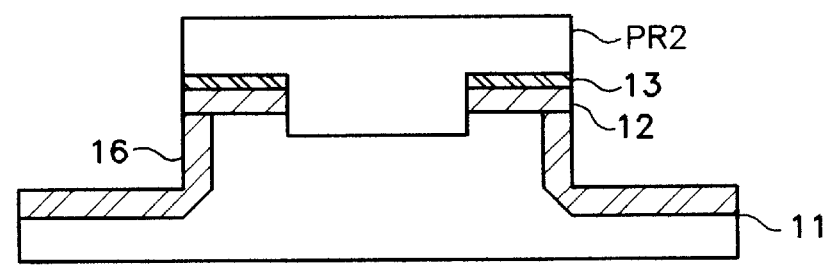

FIG. 5 is sectional view showing the step of forming a vertical channel layer 16. Firstly, silicon ions of low concentration are implanted into the exposed substrate using the second photoresist pattern PR2 as a mask. At this time, the silicon ions of low concentration are inclined doped by tilting the substrate 11 so as to implant uniformly over the vertical side of the exposed substrate. The lightly doped sidewall of the exposed substrate 11 serves as the vertical channel layer 16 of transistors. The vertical side may be 90 degree to the horizontal substrate.

Figure 6:
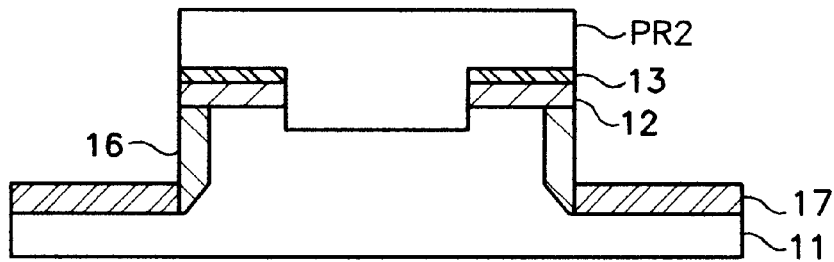

FIG. 6 illustrates the step of ion implanting to form a drain region 17. Silicon ions of high concentration are vertically implanted into the horizontal side of the exposed substrate 11 using same mask. The heavily doped horizontal side of the exposed substrate 11 is used as N+ drain region 17 of transistors. Next, in order to activate ion-implanted dopants, an annealing process is performed, and then the second photoresist pattern PR2 is removed.

Figure 7:
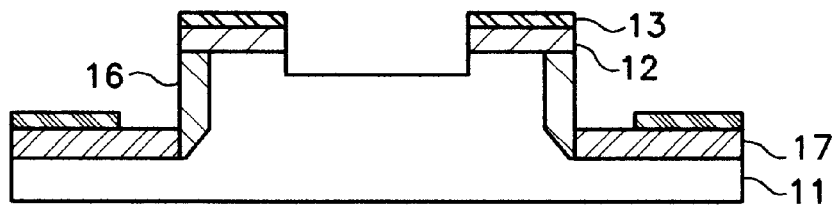

Referring to FIG. 7, an ohmic contact layer 18 is formed on the heavily doped N+ drain layer 17.

Figure 8:
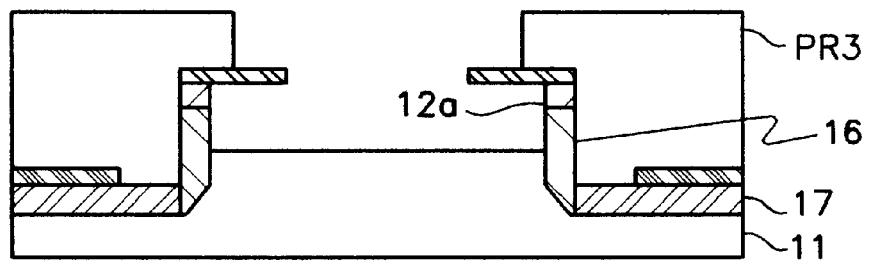

FIG. 8 illustrate the step of third etching to form a source 12a. Firstly, a third photoresist pattern PR3 for exposing the firstly etched portion of the GaAs substrate 11 is formed. Next, the exposed GaAs substrate 11 is etched using the third photoresist pattern PR3 and the insulation layer 13 as a etching mask. At this time, the third etching uses an isotropic etching process which is simultaneously etched to vertical and horizontal direction.

Therefore, the portion of source region 12 and the vertical channel layer 16 are etched together with the exposed substrate 11. As a result, the size of the channel 16 and the source 12a depending on characteristics of the transistor can be easy to control at quite small.

Figure 9:
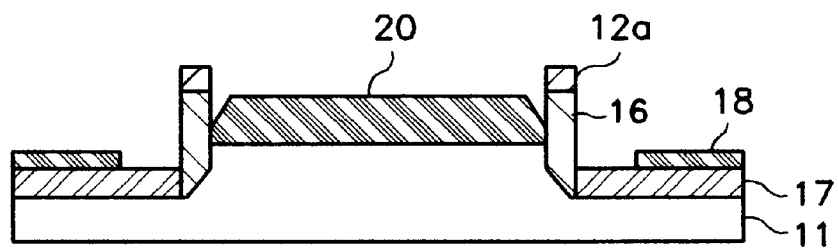

FIG. 9 illustrates the step of forming a gate electrode 20. Firstly, a metal is deposited on the thirdly etched substrate using evaporation method such as an electron-beam deposition. At this time, the third photoresist pattern PR3 and the insulating layer 13 used as a mask. Then, the third photoresist pattern PR3 and the insulating layer 13 are removed together with the metal deposited on the mask by using lift-off process.

The metal deposited on the thirdly etched substrate is electrically connect with the vertical channel layer 16, and then the metal contact with the vertical channel 16 used as the gate electrode 20, as shown in FIG. 9.

As described above, the contact portion between the gate electrode 20 and the vertical channel 16 is determined by deposition conditions and the thickness of the gate metal. Therefore, the contact portion between the gate electrode 20 and the vertical channel 16 has exceedingly small size compare to conventional MESFET. Accordingly, the present invention can be easily fabricated the vertical channel FET having an exceedingly small gate length without sophisticated submicrometer lithographic processes. Also, by controlling the space distance between vertical channels and the deposited thickness of the gate metal, the square measure of the gate metal 20 can be fabricated very large. As a result, a sheet resistance of gate can be dramatically decreased.

Figure 10:
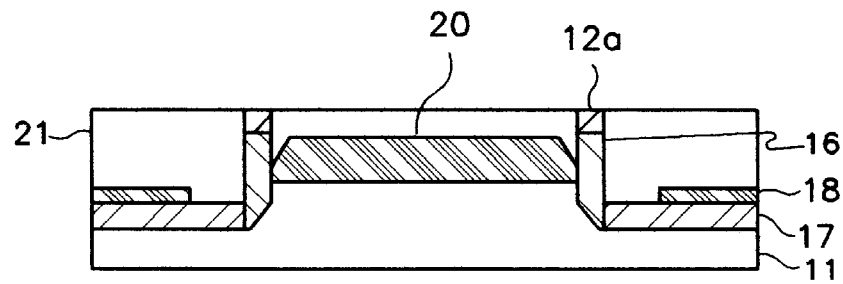

Referring to FIG. 10, on the resultant sample, an interlayer dielectric film 21 is coated. Then, a flatness is performed. For example, a chemical mechanical polishing (CMP) is carry out using the N+ source 12a as a stopping layer. As a result, the N+ source layer 12a is exposed.

Figure 11:
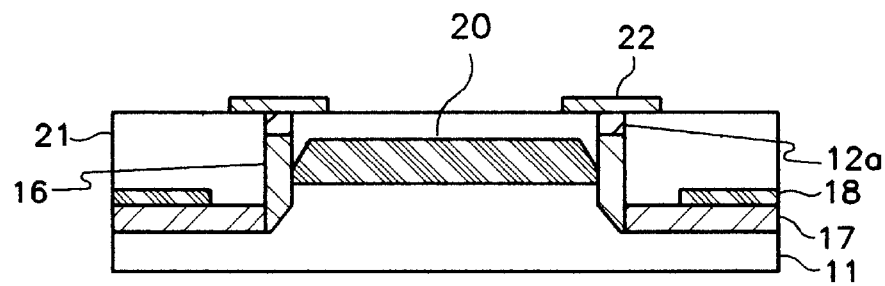

Referring to FIG. 11, on the exposed N+ source layer 12a, a low resistive metal layer for ohmic contact with the N+ source layer 12a is deposited. Next, an ohmic contact layer 22 is formed on the N+ source layer 12a by using an annealing process.

Figure 12:
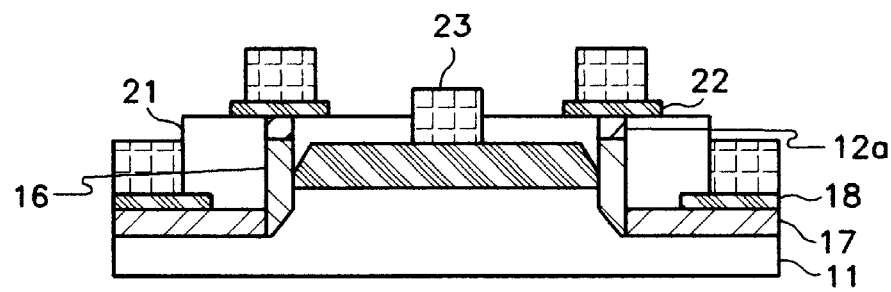

Referring to FIG. 12, by using standard optical lithography patterning, the interlayer dielectric film 21 is selectively etching and then the drain layer 18 and the gate electrode 20 are partially opening. Finally, on the exposed gate electrode 20, the exposed source layer 22 and the exposed drain layer 18, metal wires 23 are formed respectively. As a result, the vertical channel transistor according to the preferred embodiment is fabricated, as shown in FIG. 12.

According to the preferred embodiments of the present invention, the aforementioned process allows fabrication of high speed, submicron vertical channel MESFET without additional complex processes.

As described above, this invention has advantageous as follows.

Firstly, the present invention can be easily manufactured a vertical channel FET having an exceedingly small gate length without sophisticated submicrometer lithographic processes.

Secondly, this invention can be easily manufactured a vertical channel FET having a low source/drain series resistance since the source and the drain are completely isolated.

Thirdly, because one side of the vertical channel is surrounded by thick dielectric films, ON-OFF characteristics of transistor is enhanced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for manufacturing a vertical channel transistor comprising the steps of:

a) selectively implanting a dopant of high concentration into a semiconductor substrate to form a source region;

b) firstly etching the semiconductor substrate using an insulator and a first photoresist pattern as a mask;

c) secondly etching the substrate using a second photoresist pattern having a shape corresponding to said source region as a mask;

d) implanting a dopant of low concentration into the exposed substrate using said second photoresist pattern as a mask to form a vertical channel layer;

e) implanting a dopant of high concentration into the exposed substrate using same mask to form a drain region;

f) activating said dopants, and forming an ohmic contact layer on said drain region;

g) thirdly etching using a third photoresist pattern for exposing the firstly etched portion of the substrate as a mask;

h) depositing a gate metal on the substrate exposed by the thirdly etching;

i) forming a interlayer dielectric film, and forming an ohmic contact layers on the remained source region; and j) opening the source, the drain and the gate, and wiring a metal, respectively.

2. The method as claimed in claim 1, wherein said semiconductor substrate is made of a gallium arsenide substrate.

3. The method as claimed in claim 1, wherein said firstly etching uses an anisotropic etching so as to etch vertically toward the substrate.

4. The method as claimed in claim 1, wherein the etched depth of firstly etching is more deep than that of the source region.

5. The method as claimed in claim 1, wherein said implanting step of (d) is inclined doped by tilting the substrate so as to form the vertical channel layer with uniform doping level.

6. The method as claimed in claim 1, wherein said thirdly etching step uses an isotropic etching so as to control the thickness of the vertical channel layer and the size of the source.

* * * * *